(12) United States Patent
Jan et al.

(10) Patent No.: US 8,680,516 B2
(45) Date of Patent: Mar. 25, 2014

(54) PACKAGING STRUCTURE AND METHOD FOR OLED

(75) Inventors: Der-Jun Jan, Taoyuan County (TW); Kou-Chen Liu, Taoyuan County (TW); Yi-Lin Chiang, Taoyuan County (TW)

(73) Assignee: Institute of Nuclear Energy Research Atomic Energy Council, Executive Yuan, Taoyuan County (TW)

( * ) Notice: Subject to any disclaimer, the term of this patent is extended or adjusted under 35 U.S.C. 154(b) by 0 days.

(21) Appl. No.: 13/239,581

(22) Filed: Sep. 22, 2011

(65) Prior Publication Data

US 2012/0098022 A1    Apr. 26, 2012

(30) Foreign Application Priority Data

Oct. 21, 2010 (TW) ............................... 99135931 A

(51) Int. Cl.
*H01L 51/00*    (2006.01)

(52) U.S. Cl.
USPC .................. 257/40; 438/99; 257/E51.022

(58) Field of Classification Search
USPC ............... 438/15, 25–28, 51, 55, 64–68, 438/106–127, 340–384, 99; 257/40, 642, 257/E51.022, E25.008
See application file for complete search history.

(56) References Cited

U.S. PATENT DOCUMENTS

| | | | |
|---|---|---|---|
| 7,002,294 B2 * | 2/2006 | Forrest et al. | 313/506 |
| 2007/0248768 A1 * | 10/2007 | Loboda et al. | 427/574 |
| 2008/0272367 A1 * | 11/2008 | Cok | 257/40 |
| 2009/0236982 A1 * | 9/2009 | Liu et al. | 313/504 |
| 2009/0242851 A1 * | 10/2009 | Mayuzumi | 252/512 |
| 2009/0289549 A1 * | 11/2009 | Lee et al. | 313/553 |
| 2009/0291293 A1 * | 11/2009 | Sakakura | 428/323 |
| 2010/0080929 A1 * | 4/2010 | Erlat et al. | 427/535 |
| 2010/0164369 A1 * | 7/2010 | Yeh et al. | 313/504 |
| 2011/0204492 A1 * | 8/2011 | Xie et al. | 257/635 |
| 2012/0228641 A1 * | 9/2012 | Thoumazet et al. | 257/79 |

* cited by examiner

*Primary Examiner* — Quoc Hoang
(74) *Attorney, Agent, or Firm* — WPAT, PC; Justin King

(57) ABSTRACT

The present invention discloses a packaging structure and method for organic light emitting devices, in which the packaging structure comprises a substrate; an OLED device, which disposing on the substrate; a first transparent protection layer, which forming on the OLED device; and a second transparent protection layer, which forming on the first transparent protection layer.

6 Claims, 2 Drawing Sheets

PACKAGING STRUCTURE AND METHOD FOR OLED

FIELD OF THE INVENTION

The present invention relates to a packaging structure and method applying in the semiconductor industry, and more particularly, to a packaging structure and method for OLED.

BACKGROUND OF THE INVENTION

In the structure of an organic light-emitting diode (OLED), the organic material and the high-purity metallic material are sensitive to water vapor and oxygen. If there exist water vapor or oxygen in operation, the organic material will produce a redox reaction with the water vapor or the oxygen. The redox reaction may lead to reduce the performance of the device. Therefore, when the device fabrication is completed, the device should subject to a packaging process in order to protect the device.

In many typical packaging process, a piece of thin glass is used as a lid, and the UV-glue is using for sealing the OLED device all around. Although the OLED device has a better performance in sealing by using this method, the increase of the glass may lead to increase the overall weight and thickness of the OLED device.

Therefore, it is in need of a packaging structure and method for organic light emitting devices.

SUMMARY OF THE INVENTION

In view of the disadvantages of prior art, the primary object of the present invention is to provide a packaging structure and method for organic light emitting devices aiming for weight and thickness reduction.

To achieve the above object, the present invention provides a packaging structure for organic light emitting devices, comprising: a substrate; an OLED device, which disposing on the substrate; a first transparent protection layer, which forming on the OLED device; a second transparent protection layer, which forming on the first transparent protection layer.

The present invention also provides a packaging method for organic light emitting devices, comprising: disposing a OLED device on a substrate, and placing the substrate and the OLED device in a high vacuum environment (the pressure of the environment is 5.0E-6 Torr); sputtering ZnO on the cathode of the OLED device to form a first transparent protection layer; placing the substrate and the OLED device in another vacuum environment (the pressure of the environment is 10E-3 Torr), and injecting HMDSO, Ar and $N_2O$ into the environment; and controlling the mixed vapor (Ar and $N_2O$) flow rate for forming $SiO_xC_y$ on the first transparent protection layer by using PECVD in order to form a second transparent protection layer.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus are not limitative of the present invention and wherein.

DESCRIPTION OF THE EXEMPLARY EMBODIMENTS

For your esteemed members of reviewing committee to further understand and recognize the fulfilled functions and structural characteristics of the invention, several exemplary embodiments cooperating with detailed description are presented as the follows.

Figure 1:
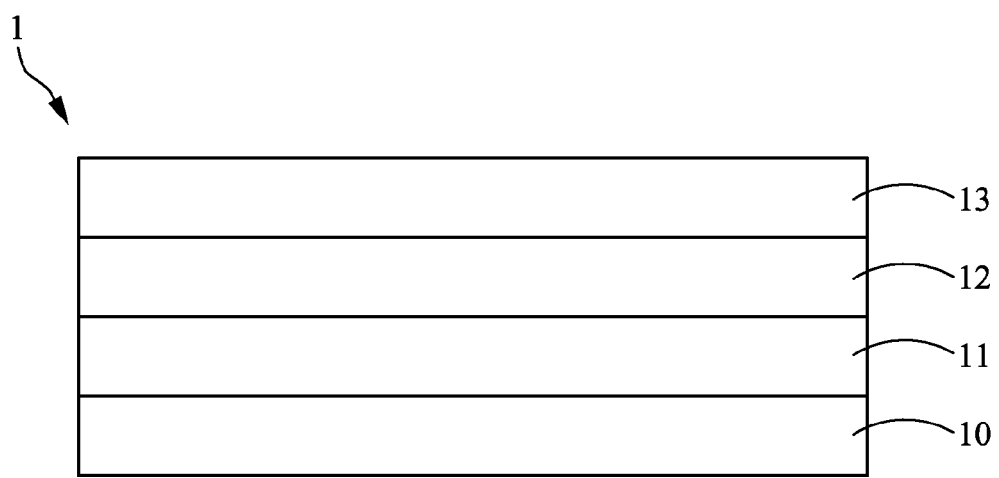
FIG. 1 is a schematic diagram showing a packaging structure for organic light emitting devices

Please refer to FIG. 1, which is a schematic diagram showing a packaging structure for organic light emitting devices according to the present invention. As shown in FIG. 1, a packaging structure for organic light emitting devices 1, comprising: a substrate 10, the material is glass or soft material; a OLED device 11, disposing on the substrate 10; a first transparent protection layer 12, forming on the OLED device, the material is zinc oxide (ZnO), and the visible light transmittance greater than 80%; a second transparent protection layer 13, forming on the first transparent protection layer 12, and the material is $SiO_xC_y$.

Figure 2:
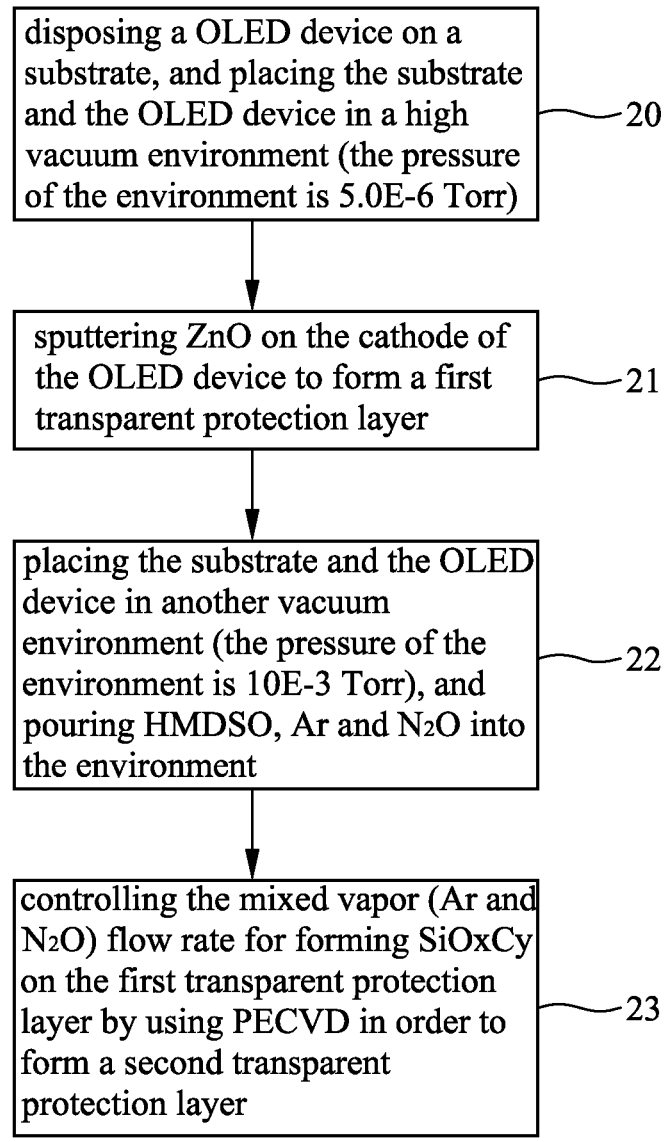
FIG. 2 is a flow chart showing a packaging method for organic light emitting devices

Please refer to FIG. 2, which is a flow chart showing a packaging method for organic light emitting devices according to the present invention. As shown in FIG. 2, step 20, disposing a OLED device 11 on a substrate 10, and placing the substrate 10 and the OLED device 11 in a high vacuum environment (the pressure of the environment is 5.0E-6 Ton).

Step 21, sputtering ZnO on the cathode of the OLED device 11 to form a first transparent protection layer 12.

Step 22, placing the substrate 10 and the OLED device 11 in another vacuum environment (the pressure of the environment is 10E-3 Ton), and injecting hexamethyldisiloxane (HMDSO), argon (Ar) and nitrogen oxide ($N_2O$) into the environment.

Step 23, controlling the mixed vapor argon (Ar) and nitrogen oxide (N2O) flow rate for forming SiOxCy on the first transparent protection layer 12 by using plasma-enhanced chemical vapor deposition (PECVD) in order to form a second transparent protection layer 13. As time increases, increase the ratio of the flow rate of $N_2O$ to the flow rate of ($N_2O$+Ar) from 0% to 100%. That is, the chemical vapor deposition operation is started from the 0% flow rate of the mixed vapor and finished at the 100% flow rate of the mixed vapor. The structure of the deposition of the 0% flow rate of the mixed vapor is polymer-like, which has lower hardness and can reduce the stress between the interface of the first transparent protection layer 12 and the second transparent protection layer 13. The structure of the 100% flow rate of the mixed vapor is SiO2-like, which has higher hardness and can protect the OLED device 11 from damage causing by external force.

With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention.

What is claimed is:

1. A packaging structure for organic light emitting devices, comprising:
   a substrate;
   an OLED device disposed on the substrate;
   a first transparent protection layer formed on the OLED device, wherein visible light transmittance of the first transparent protection layer is greater than 80%; and
   a second transparent protection layer formed adjacent and above the first transparent protection layer.

2. The packaging structure of claim 1, wherein the material of the first transparent protection layer is ZnO.

3. The packaging structure of claim 2, wherein the material of the second transparent protection layer is $SiO_xC_y$.

4. The packaging structure of claim 1, wherein the material of the second transparent protection layer is $SiO_xC_y$.

5. A packaging method for organic light emitting devices, comprising:
   disposing a OLED device on a substrate, and placing the substrate and the OLED device in a high vacuum environment (the pressure of the environment is 5.0E-6 Torr);
   sputtering ZnO on the cathode of the OLED device to form a first transparent protection layer, wherein visible light transmittance of the first transparent protection layer is greater than 80%;
   placing the substrate and the OLED device in another vacuum environment (the pressure of the environment is 10E-3 Torr), and pouring HMDSO, Ar and $N_2O$ into the environment; and
   controlling the flow rate of mixed vapor (Ar and $N_2O$) for forming $SiO_xC_y$ on the first transparent protection layer by using PECVD in order to form a second transparent protection layer, wherein the second transparent protection layer is adjacent and above the first transparent protection layer.

6. The packaging method of claim 5, wherein the ratio of the flow rate of $N_2O$ to the flow rate of ($N_2O$ +Ar) in the chemical vapor deposition operation is increasing with time, starting from 0% and finished at 100%.

* * * * *